US011751427B2

(12) United States Patent
Sasaki

(10) Patent No.: US 11,751,427 B2
(45) Date of Patent: Sep. 5, 2023

(54) ELECTRONIC DEVICE

(71) Applicant: Japan Display Inc., Tokyo (JP)

(72) Inventor: Yusuke Sasaki, Minato-ku (JP)

(73) Assignee: Japan Display Inc., Tokyo (JP)

( * ) Notice: Subject to any disclaimer, the term of this patent is extended or adjusted under 35 U.S.C. 154(b) by 81 days.

(21) Appl. No.: 17/474,624

(22) Filed: Sep. 14, 2021

(65) Prior Publication Data
US 2021/0408484 A1 Dec. 30, 2021

Related U.S. Application Data

(63) Continuation of application No. 16/407,660, filed on May 9, 2019, now Pat. No. 11,152,596.

(30) Foreign Application Priority Data

May 14, 2018 (JP) .................................. 2018-092864

(51) Int. Cl.
*H10K 50/844* (2023.01)
*H10K 50/11* (2023.01)
*H10K 50/842* (2023.01)
*H10K 59/122* (2023.01)

(52) U.S. Cl.
CPC ......... *H10K 50/8445* (2023.02); *H10K 50/11* (2023.02); *H10K 50/8426* (2023.02); *H10K 59/122* (2023.02)

(58) Field of Classification Search
CPC . H10K 50/8445; H10K 50/8426; H10K 59/12
See application file for complete search history.

(56) References Cited

U.S. PATENT DOCUMENTS

| 5,039,204 A | 8/1991 | Choi |
| 2006/0158111 A1 | 7/2006 | Hayashi |
| 2009/0153042 A1 | 6/2009 | Izumi et al. |
| 2014/0225089 A1 | 8/2014 | Kato et al. |
| 2018/0061899 A1* | 3/2018 | Oh ........................ H10K 59/124 |
| 2018/0124933 A1 | 5/2018 | Park et al. |

FOREIGN PATENT DOCUMENTS

| JP | 2006-222070 A | 8/2006 |
| JP | 2007-250370 | 9/2007 |
| JP | 2009-164107 A | 7/2009 |
| JP | 2009-266922 A | 11/2009 |
| JP | 2014-154450 | 8/2014 |

OTHER PUBLICATIONS

Japanese Office Action dated Nov. 16, 2021 in Japanese Patent Application No. 2018-092864 (with unedited computer generated English translation), citing documents AA and AO through AQ therein, 8 pages.

* cited by examiner

*Primary Examiner* — Tucker J Wright
(74) *Attorney, Agent, or Firm* — Maier & Maier, PLLC

(57) ABSTRACT

A display device includes a light-emitting element layer on the substrate and having a display area for displaying images, and a sealing layer covering the light-emitting element layer. The sealing layer includes a first inorganic film, an organic film on the first inorganic film, a second inorganic film on the organic film, and a third inorganic film. The first inorganic film and the second inorganic film are in contact with each other around the organic film. The third inorganic film, without overlapping with the display area, covers a peripheral portion of the organic film.

9 Claims, 11 Drawing Sheets

ELECTRONIC DEVICE

CROSS-REFERENCE TO RELATED APPLICATION

The present application is a continuation of U.S. application Ser. No. 16/407,660 filed May 9, 2019, and claims priority from Japanese application JP2018-92864 filed on May 14, 2018, the content of each of which is hereby incorporated by reference into this application.

BACKGROUND OF THE INVENTION

1. Field of the Invention

This relates to display devices.

2. Description of the Related Art

A light-emitting element layer such as an organic electroluminescence layer, which is vulnerable to moisture, needs to be covered with a sealing layer to be blocked from air. One of known structures includes a sealing layer having a multilayer structure, where an organic film made from resin is interposed between a pair of inorganic films, for sealing the light-emitting element layer. The structure, in spite of foreign objects included therein, is filled with the organic film to even irregularities, preventing a defect of the inorganic films, obtaining high barrier performance (JP 2007-250370A and JP 2014-154450A).

The organic film at its peripheral portion is made thinner in an outward direction when the pair of inorganic films are in contact with each other around the organic film, leading to low coverage of the foreign objects, making it unlikely to completely prevent the defect of the inorganic films. This may degrade barrier performance.

SUMMARY OF THE INVENTION

This is to aim at preventing degradation of barrier performance.

A display device includes substrate, a light-emitting element layer having a display area for displaying images, and a sealing layer covering the light-emitting element layer. The sealing layer includes a first inorganic film, an organic film on the first inorganic film, a second inorganic film on the organic film, and a third inorganic film. The first inorganic film and the second inorganic film are in contact with each other around the organic film. The third inorganic film, without overlapping with the display area, covers a peripheral portion of the organic film.

The third inorganic film may prevent deterioration of barrier performance.

DETAILED DESCRIPTION OF THE INVENTION

Figure 1:
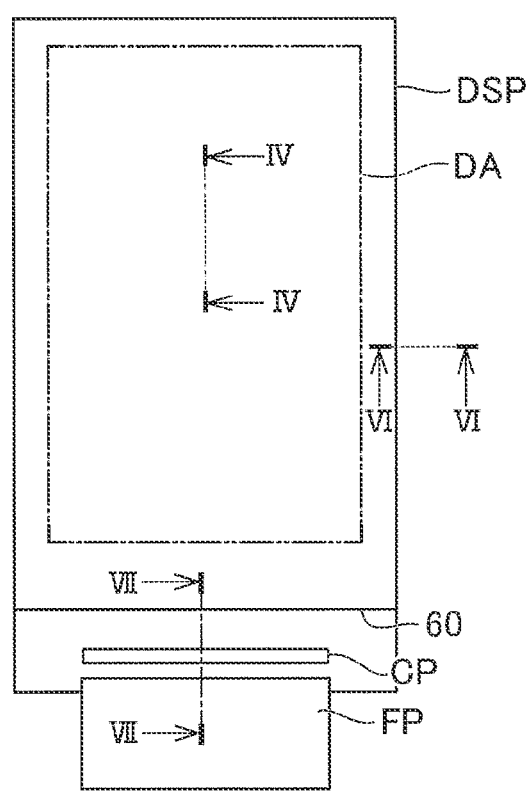
FIG. 1 is a plan view of a display device in an embodiment.

Hereinafter, some embodiments will be described with reference to the drawings. Here, the invention can be embodied according to various aspects within the scope of the invention without departing from the gist of the invention and is not construed as being limited to the content described in the embodiments exemplified below.

The drawings are further schematically illustrated in widths, thickness, shapes, and the like of units than actual forms to further clarify description in some cases but are merely examples and do not limit interpretation of the invention. In the present specification and the drawings, the same reference numerals are given to elements having the same functions described in the previously described drawings and the repeated description will be omitted.

Further, in the detailed description, "on" or "under" in definition of positional relations of certain constituents and other constituents includes not only a case in which a constituent is located just on or just under a certain constituent but also a case in which another constituent is interposed between constituents unless otherwise mentioned.

Figure 2:
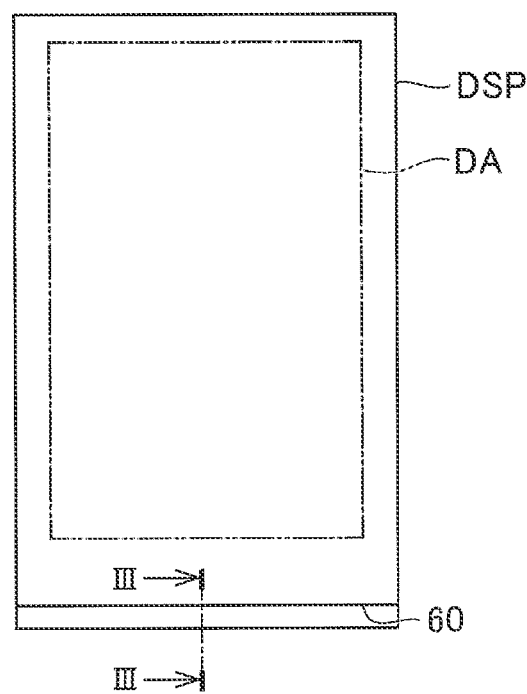
FIG. 2 is a schematic view of the display device in use.
Figure 3:
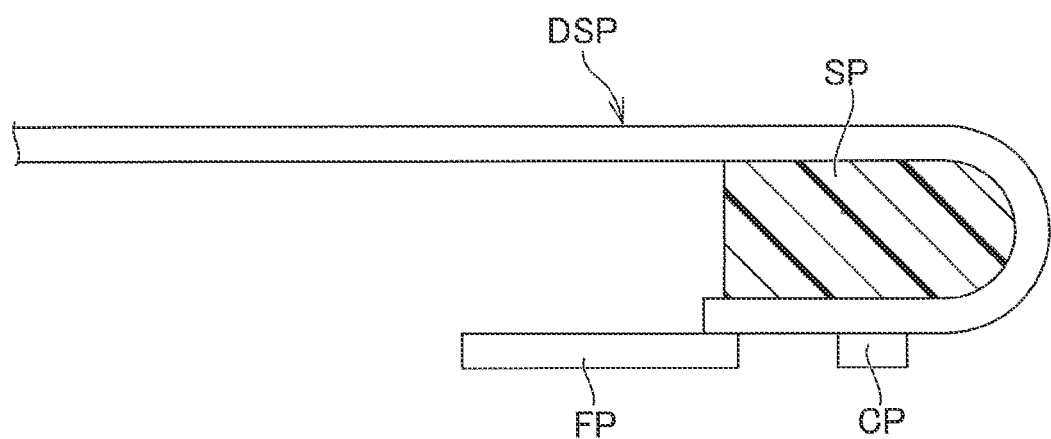
FIG. 3 is a III-III line schematic cross-sectional view of the display device in FIG. 2.

FIG. 1 is a plan view of a display device in an embodiment. The display device is actually folded to be used, FIG. 1 is a developed view of the display device before it is folded. FIG. 2 is a schematic view of the display device in use. FIG. 3 is a III-III line schematic cross-sectional view of the display device in FIG. 2.

The display device includes a display DSP. A spacer SP is placed inside curvature, preventing the display DSP from being bent too much. The display DSP has flexibility and is folded outside the display area DA. The display DSP has an integrated circuit chip CP mounted thereon for driving an element to display images. A flexible printed circuit board FP is connected to the display DSP outside the display area DA.

The display device may be an organic electroluminescence display device. The display device has a display area DA for displaying the images. The display area DA displays a full-color image by forming full-color pixels, each of which consists of unit pixels (subpixels) in some colors such as red, green, and blue.

Figure 4:
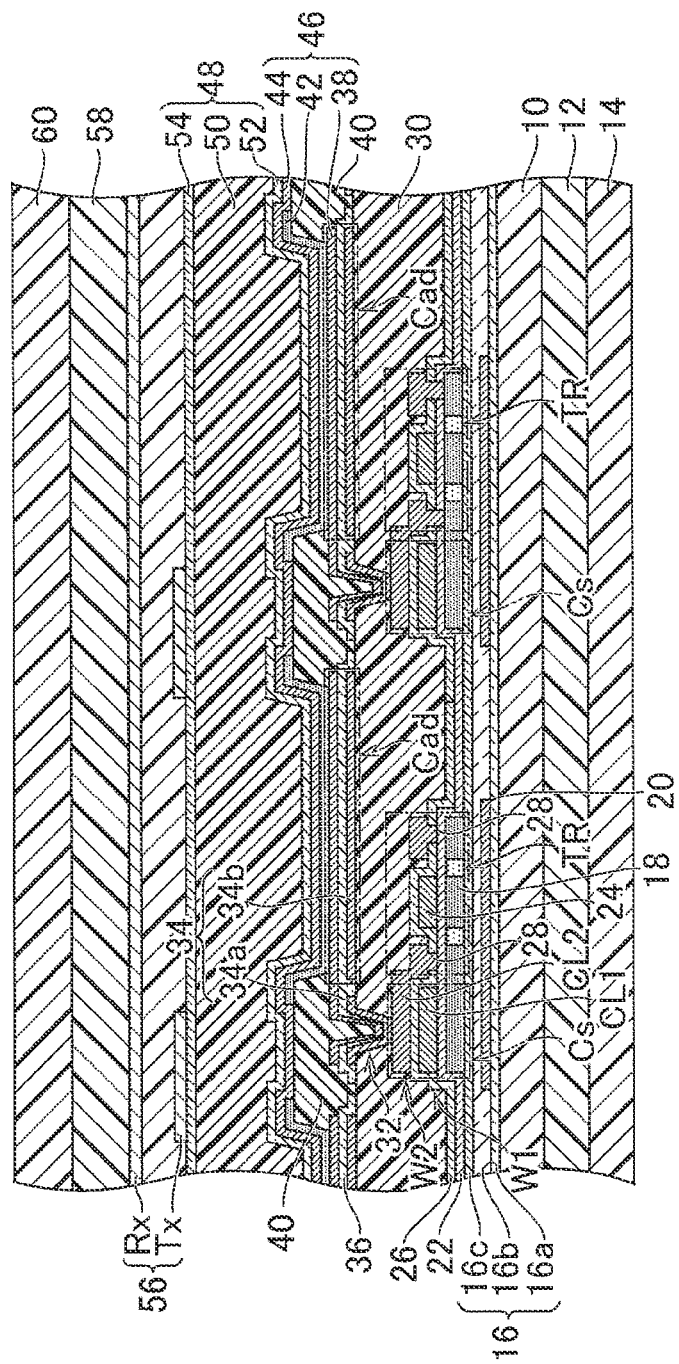
FIG. 4 is a IV-IV line cross-sectional view of the display device in FIG. 1.

FIG. 4 is a IV-IV line cross-sectional view of the display device in FIG. 1. A resin substrate 10 is formed from polyimide. Or, other resin materials can be used as long as the materials have satisfactory flexibility for a sheet display or a flexible display. A reinforcing film is put on a back of the resin substrate 10 with a pressure-sensitive adhesive 12 interposed therebetween.

A barrier inorganic film 16 (undercoat layer) is laminated on the resin substrate 10. The barrier inorganic film 16 has a three-layer laminated structure of a silicon oxide film 16a, a silicon nitride film 16b, and a silicon oxide film 16c. The silicon oxide film 16a of the lowest layer is for improving close-fitting properties with the resin substrate 10; the silicon nitride film 16b of the middle layer is a blocking film from external moisture and impurities; the silicon oxide film 16c of the uppermost layer is another blocking film to prevent hydrogen atoms in the silicon nitride film 16b from diffusing on a side of a semiconductor layer 18 of a thin film transistor TR. Such a structure, however, is not essential. Another layer or a two-layer laminate is applicable thereto.

An additional film 20 may be formed in response to an area where the thin film transistor TR is formed. The additional film 20 may curb a characteristic change of the thin film transistor TR due to light intrusion from its channel back or may provide the thin film transistor TR with a backgating effect by being formed from a conductive material to apply a certain potential. In the embodiment, after the silicon oxide film 16a is formed, the additional film 20 is formed in an island shape corresponding to the area where the thin film transistor TR is formed, and then the silicon nitride film 16b and the silicon oxide film 16c are laminated, whereby the additional film 20 is sealed in the barrier inorganic film 16. Alternatively, the additional film 20 may be formed on the resin substrate 10, prior to forming the barrier inorganic film 16.

The thin film transistor TR is on the barrier inorganic film 16. A polysilicon thin film transistor is illustrated and only an N-ch transistor is herein shown but a P-ch transistor may be simultaneously formed. The semiconductor layer 18 of the thin film transistor TR has a structure where a low concentration impurity area is provided between a channel area and a source/drain area. A silicon oxide film is herein used for a gate insulating film 22. A gate electrode 24 is a part of a first wiring layer W1 made from MoW. The first wiring layer W1 includes a first storage capacitor line CL1 in addition to the gate electrode 24. A part of a storage capacitor Cs is formed between the first storage capacitor line CL1 and the semiconductor layer 18 (source/drain area) with the gate insulating film 22 interposed therebetween.

An interlayer dielectric 26 (silicon oxide film and silicon nitride film) is laminated on the gate electrode 24. A second wiring layer W2, which includes portions for the source/drain electrode 28, is on the interlayer dielectric 26. A three-layer laminated structure made from Ti, Al, and Ti is herein employed. The first storage capacitor line CL1 (part of the first wiring layer W1) and a second storage capacitor line CL2 (part of the second wiring layer W2) constitute another portion of the storage capacitor Cs, with the interlayer dielectric 26 interposed therebetween.

A flattening organic film 30 covers the source/drain electrode 28. Resins such as photosensitive acrylic are used for the flattening organic film 30 because of superior surface flatness, compared with inorganic insulation materials formed by chemical vapor deposition (CVD).

The flattening organic film 30 is removed at a pixel contact portion 32 and has an indium tin oxide (ITO) film 34 formed thereon. The indium tin oxide film 34 includes a first transparent conductive film 34a and a second transparent conductive film 34b separated from each other.

The second wiring layer W2, which has its surface exposed by removing the flattening organic film 30, is covered with the first transparent conductive film 34a. A silicon nitride film 36 is on the flattening organic 30, covering the first transparent conductive film 34a. The silicon nitride film 36 has an opening at the pixel contact portion 32. A pixel electrode 38 is laminated on and connected to the source/drain electrode 28 through the opening. The pixel electrode 38 is a reflective electrode and has a three-layer laminated structure of an indium zinc oxide film, an Ag film and an indium zinc oxide film. Instead of the indium zinc oxide film, an indium tin oxide film can be used. The pixel electrode 38 extends laterally from the pixel contact portion 32 and to above the thin film transistor TR.

The second transparent conductive film 34b is adjacent to the pixel contact portion 32 and under the pixel electrode 38 (further below the silicon nitride film 36). The second transparent conductive film 34b, the silicon nitride film 36, and the pixel electrode 38 overlap with one another, thereby forming an additional capacitance Cad.

An insulation organic film 40, which is called a bank (rib) for a partition of adjacent pixel areas, is on the flattening organic film 30 and over the pixel contact portion 32, for example. Photosensitive acrylic may be used for the insulation organic film 40 same as the flattening organic film 30. The insulation organic film has an opening for exposing a surface of the pixel electrode 38 as a light-emitting region. The opening should have an edge in a gently declined shape. A steep shape of the opening edge may cause insufficient coverage of an organic electroluminescence layer 42 formed thereon.

The flattening organic film 30 and the insulation organic film 40 are in contact with each other through an opening in the silicon nitride film 36 between them. This makes it possible to remove moisture and gas desorbed from the flattening organic film 30 through the insulation organic film 40 during heat treatment after the insulation organic film 40 is formed.

An organic electroluminescence layer 42, made from organic materials, for example, is laminated on the pixel electrode 38. The organic electroluminescence layer 42 may be a single layer or may have a structure where a hole transport layer, a light-emitting layer, and an electron transport layer are laminated in this order from the pixel electrode 38. These layers may be formed by vapor deposition or by application after solvent dispersion, may be selectively formed for respective pixel electrodes 38 (respective sub-pixels), or may be formed entirely over the display area DA. The overall formation results in a structure for emitting white light, from which desired color wavelength portion is extracted at every sub-pixel through a color filter (not shown in the figures).

A counter electrode 44 is on the organic electroluminescence layer 42. Due to a top emission structure employed herein, the counter electrode 44 is transparent. A Mg layer and an Ag layer may be formed to be as thin a film as outgoing light from the organic electroluminescence layer 42 can pass. In comply with the forming order of the organic electroluminescence layer 42, the pixel electrode 38 is an anode, and the counter electrode 44 is a cathode. The plurality of pixel electrodes 38, the counter electrode 44, and the organic electroluminescence layer 42 between central portion of the respective pixel electrodes 38 and the counter electrode 44 constitute light-emitting element layer 46. The light-emitting element layer 46 includes the display area DA for displaying the images.

A sealing layer 48 is on the counter electrode 44 to cover the light-emitting element layer 46. The sealing layer 48 may serve to prevent external moisture intrusion into the organic electroluminescence layer 42 formed thereunder, requiring high gas barrier properties. The sealing layer 48 has a laminated structure where an organic film 50 interposed between a first inorganic film and a second inorganic film 54 (e.g. silicon nitride film) thereover and thereunder. The first inorganic film 52 and the second inorganic film 54 are configured to be in contact with and overlap with each other around the organic film 50 (FIG. 6).

A touch sensing layer 56, a protective layer 58, and a polarizing plate 60 (e.g. circularly polarizing plate) are laminated on the sealing layer 48. The touch sensing layer 56 has some transmitting electrodes Tx and some receiving electrodes Rx, mutually intersected. The counter electrode 44 may be divided into some portions to be used for transmitting electrodes, making it possible to omit the transmitting electrodes Tx.

Figure 5:
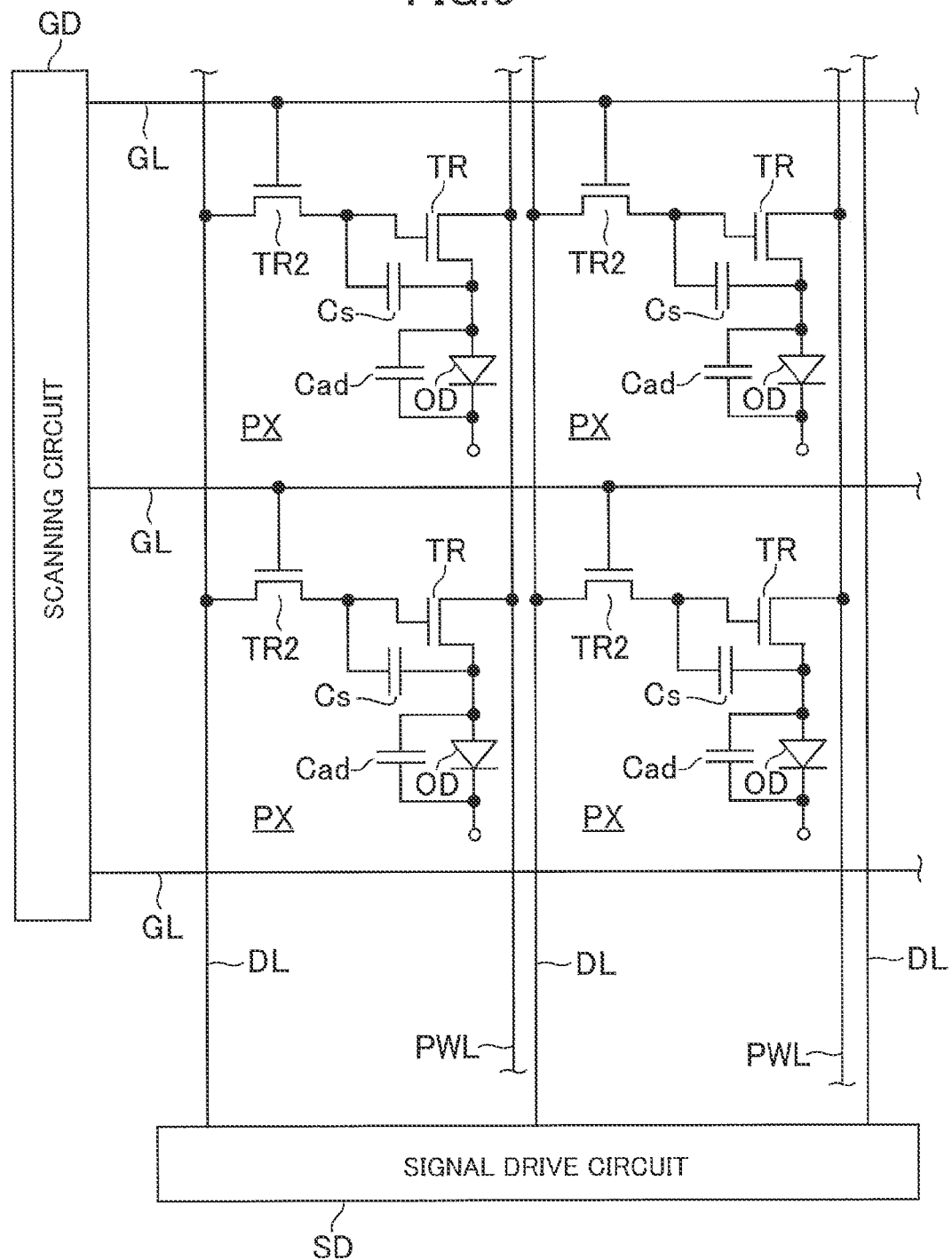
FIG. 5 is a circuit diagram of the display device in FIG. 1.

FIG. 5 is a circuit diagram of the display device in FIG. 1. The circuit includes a plurality of scan lines GL connected to a scanning circuit GD and a plurality of signal lines DL connected to a signal drive circuit SD. The signal drive circuit SD is in the integrated circuit chip CP in FIG. 1. A pixel PX is an area surrounded by adjacent two scan lines GL and adjacent two signal lines DL. The pixel PX has the thin film transistor TR as a drive transistor, a thin film transistor TR2 as a switch, and a storage capacitor Cs. By implying gate voltage to the scan line GL, the thin film transistor TR2 is turned ON, whereby a video signal is supplied from the signal line DL, and charge is stored in the storage capacitor Cs. By storing the charge in the storage capacitor Cs, the thin film transistor TR is turned ON, passing a current from a power line PWL to the light-emitting element OD. With the current, the light-emitting element OD emits light.

Figure 6:
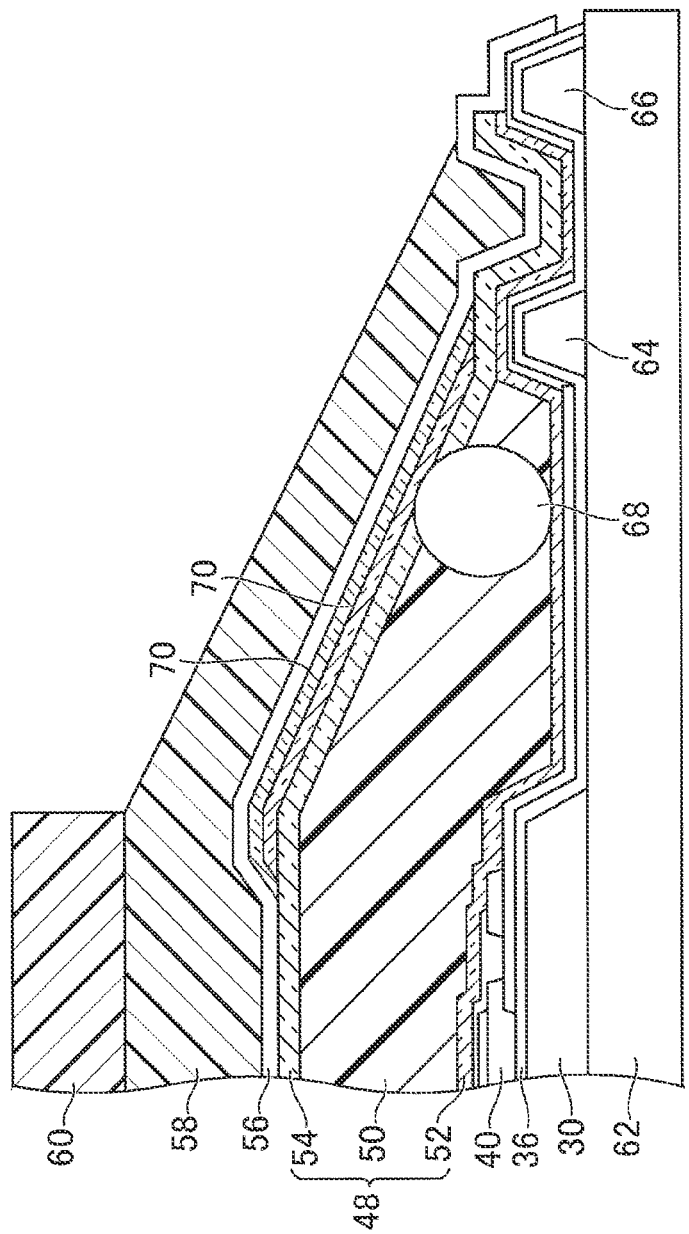
FIG. 6 is a VI-VI line cross-sectional view of the display device in FIG. 1.

FIG. 6 is a VI-VI line cross-sectional view of the display device in FIG. 1. An array substrate 62 in FIG. 6 stands for all the layers below the flattening organic film 30 in FIG. 4. The interlayer dielectric 26 is the uppermost layer of the array substrate 62, outside the display area DA. The flattening organic film 30 is on the array substrate 62. The flattening organic film 30 is formed all over the display area DA, with peripheries outside the display area DA. The flattening organic film 30 is covered with the silicon nitride film 36. The silicon nitride film 36 closely adheres to the array substrate 62 (interlayer dielectric 26 of the uppermost layer in FIG. 4), outside the flattening organic film 30, with the flattening organic film 30 sealed therebetween, preventing moisture intrusion.

A first bank 64 is provided to be spaced from the flattening organic film 30. The first bank 64 surrounds the flattening organic film 30. A second bank 66 is additionally provided to be spaced from the first bank 64. The second bank 66 surrounds the first bank 64. The first bank 64 and the second bank 66 are made from materials same as the flattening organic film 30 and are simultaneously made. Or, the flattening organic film 30, the first bank 64, and the second bank 66 are formed, with the organic layer separated. The silicon nitride film 36 continuously covers the first bank 64 and second bank 66, from above the flattening organic film 30.

The light-emitting element layer 46 in FIG. 4 extends outward from the display area DA. The sealing layer 48 is on the light-emitting element layer 46. The sealing layer 48 includes the first inorganic film 52, the organic film 50 laminated on the first inorganic film 52, and the second inorganic film 54 laminated on the organic film 50. The first inorganic film 52 and the second inorganic film 54, between which the organic film 50 is interposed, are in contact with each other around the organic film 50 (FIG. 6).

FIG. 6 shows that the organic film 50 has an upper surface sloping down at a peripheral portion in an outward direction, with less thickness closer to a tip. Due to a foreign object 68 at the peripheral portion of the organic film 50, the organic film 50 is unable to cover the foreign object 68, making it possible to make a hole in the second inorganic film 54.

The sealing layer 48 includes a third inorganic film 70. The third inorganic film 70, without overlapping with the display area DA, covers the peripheral portion of the organic film 50. The third inorganic film 70 is laminated at least one of over and under the second inorganic film 54. The third inorganic film 70 is entirely in contact with the second inorganic film 54. The third inorganic film 70 includes some layers. The third inorganic film 70 can prevent deterioration of barrier performance of the sealing layer 48.

The first bank 64 surrounds the organic film 50. The first inorganic film 52 and the second inorganic film 54 have respective tips beyond the first bank 64 from the organic film 50. The respective tips are closer to an edge of the array substrate 62 than the first bank 64. The first inorganic film 52 and the second inorganic film 54 have the respective tips above the second bank 66. The third inorganic film 70 has a tip above the first bank 64.

Figure 7:
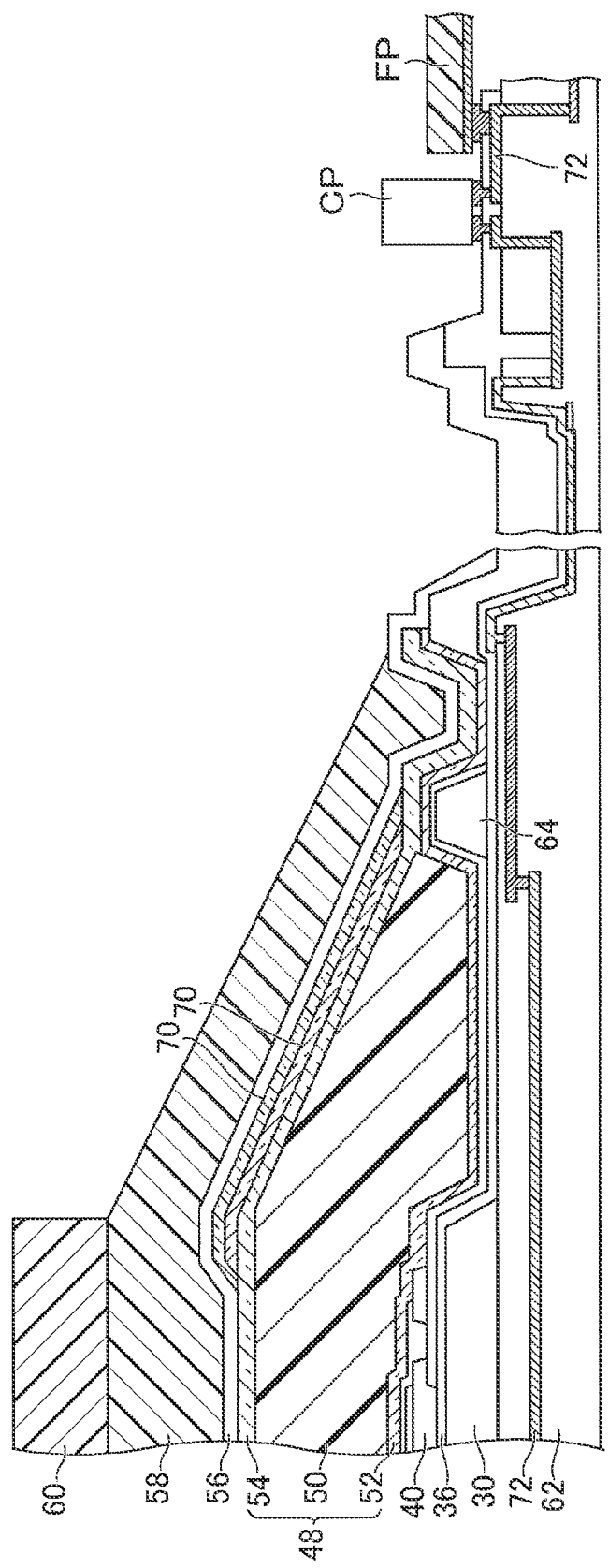
FIG. 7 is a VII-VII line cross-sectional view of the display device in FIG. 1.

FIG. 7 is a VII-VII line cross-sectional view of the display device in FIG. 1. The array substrate 62 has a trace 72 for electrical connection with the integrated circuit chip CP and the flexible printed circuit board FP. As shown in FIGS. 2 and 3, due to the display DSP being bent, a curvature area thereof does not have the flattening organic film 30. FIG. 7 illustrates that the third inorganic film 70 is formed on an external connection side.

Figure 8:
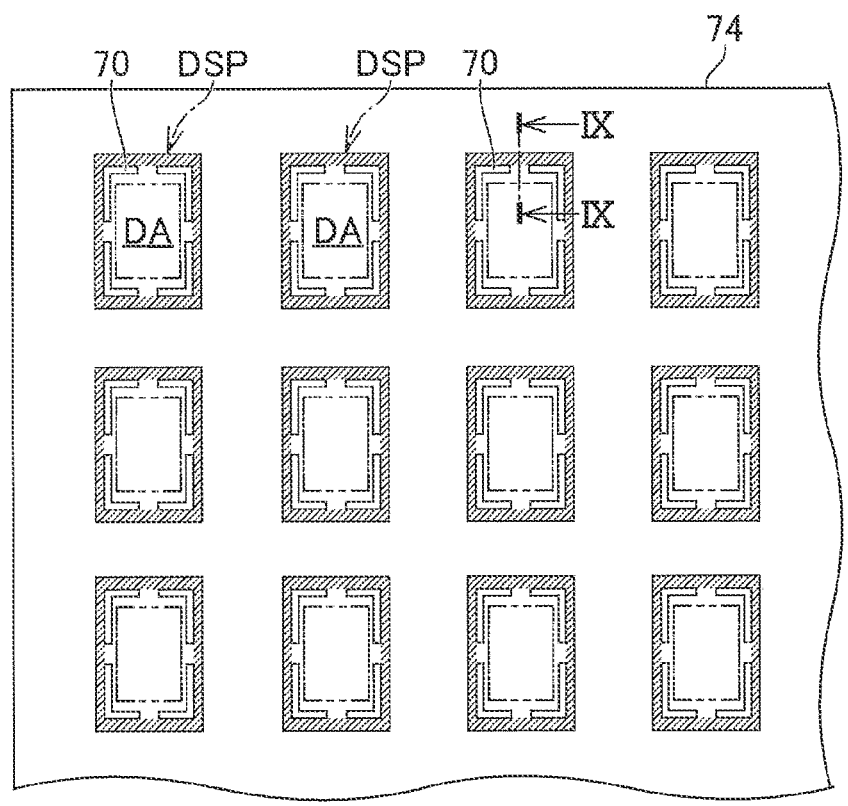
FIG. 8 is a diagram for explaining a manufacturing method of the display device.

FIG. 8 is a diagram for explaining a manufacturing method of the display device. In the embodiment, multiple displays DSP are obtained from one large substrate 74. Specifically, the resin substrate 10 in FIG. 4 is prepared without being cut and then each layer is formed.

During processes of forming the sealing layer 48 in FIGS. 6 and 7, the first inorganic film 52 and the second inorganic film 54 are laminated to entirely cover each display DSP and etched using the protective layer 58 as a mask. The protective layer 58 as a resin film is formed by applying photolithography. The second bank 66 serves to prevent materials of the protective layer 58 from flowing outward.

The first inorganic film 52 and the second inorganic film 54 are etched to expose the trace 72 as shown in FIG. 7 for electrical connection with the integrated circuit chip CP and the flexible printed circuit board FP. FIG. 8 illustrates that each display DSP at its peripheral portion have an area (hatched area) where neither the first inorganic film 52 nor the second inorganic film 54 is formed. During the formation of the organic film 50 in FIGS. 6 and 7, the first bank 64 serves to prevent resins from flowing outward.

The third inorganic film 70 is also patterned by etching after being formed to entirely cover each display DSP. The third inorganic film 70 may be formed by CVD from SiN or SiON with high barrier properties or may be formed by atomic layer deposition (ALD) method with high foreign-object-coating performance. The third inorganic film 70 is patterned to surround the display area DA.

Figure 9:
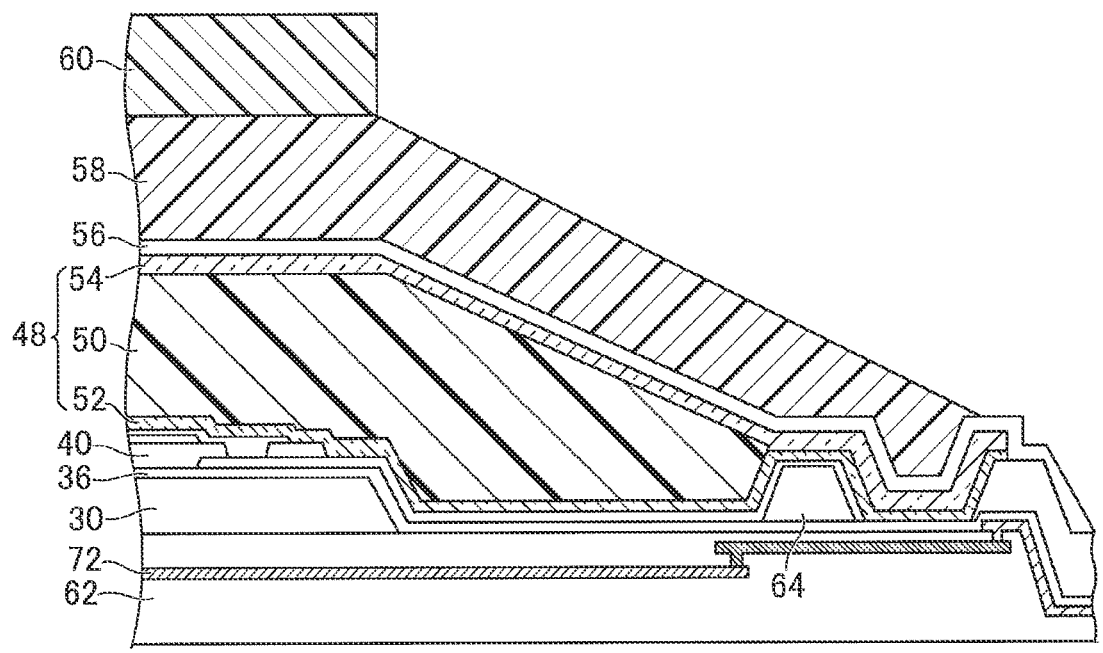
FIG. 9 is a IX-IX line cross-sectional view of the structure in FIG. 8.

FIG. 9 is a IX-IX line cross-sectional view of the structure in FIG. 8. In the embodiment, due to the etching mask being used, the third inorganic film 70 has no portion at a part of a frame area around the display area DA. The third inorganic film 70, in a plan view, has a discontinuous shape in the frame area, except for the part thereof, around the display area DA. By contrast, FIGS. 6 and 7 are cross-sectional views of an area including the third inorganic film 70. The manufacturing method includes other ways obvious from explanation of the display device.

[Variation]

Figure 10:
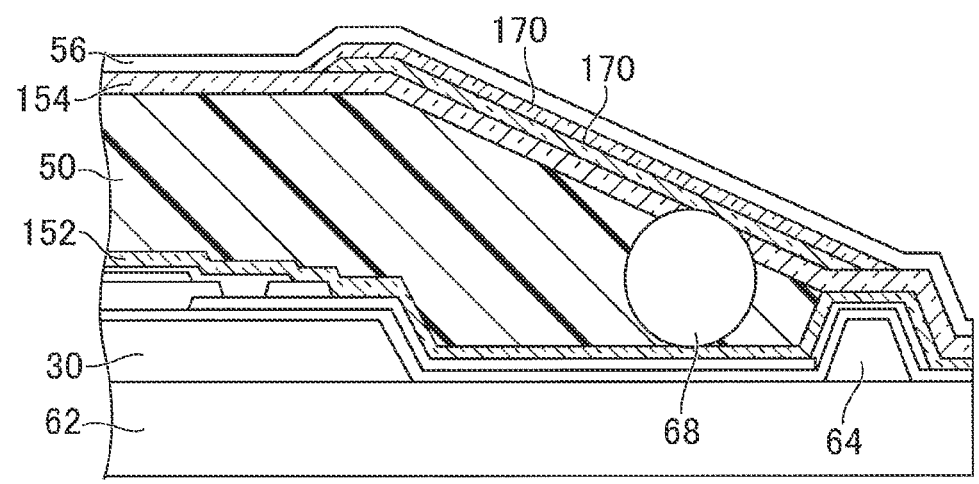
FIG. 10 is a cross-sectional view of a display device in a first variation of the embodiment.

FIG. 10 is a cross-sectional view of a display device in a first variation of the embodiment. In this example, the first inorganic film 152, the second inorganic film 154, and the third inorganic film 170 are patterned by film formation using a mask. Due to no etching being done, no second bank is formed to prevent flow of the protective layer 58.

Figure 11:
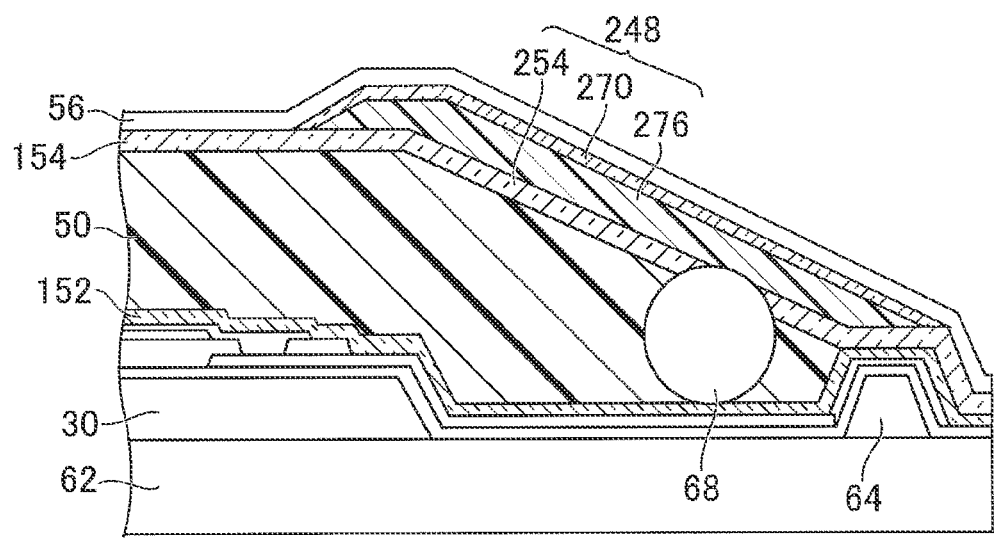
FIG. 11 is a cross-sectional view of a display device in a second variation of the embodiment.

FIG. 11 is a cross-sectional view of a display device in a second variation of the embodiment. In the example, the sealing layer 248 includes the second organic film 276 interposed between the second inorganic film 254 and the third inorganic film 270. The third inorganic film 270 is in contact with the second inorganic film 254, outside the second organic film 276. Forming the second organic film 276 can further improve foreign-object-coating performance.

The electronic device is not limited to the organic electroluminescence display device but may be a display device with a light emitting element disposed in each pixel, such as a quantum-dot light emitting diode (QLED), or a liquid crystal display device.

While there have been described what are at present considered to be certain embodiments, it will be understood that various modifications may be made thereto, and it is intended that the appended claims cover all such modifications as fall within the true spirit and scope of the invention.

What is claimed is:

1. An electronic device comprising:
   a substrate including a first area and a second area surrounding the first area;
   a hole transport layer, an electron transport layer, and a first organic layer between the hole transport layer and the electron transport layer disposed in the first area; and
   a sealing layer,
   wherein
   the sealing layer includes a first inorganic film, a second inorganic film, an organic film disposed between the first inorganic film and the second inorganic film, and a third inorganic film,
   the first inorganic film, the second inorganic film, and the organic film are disposed in the first area and the second area,
   the third inorganic film has barrier properties, is formed from SiN or SiON, and is disposed in the second area without overlapping with the first area,
   the first inorganic film, the second inorganic film, and the organic film are disposed between the third inorganic film and the substrate in the second area, and
   the first inorganic film and the second inorganic film include contacting portions that are in contact with each other in the second area, and a lateral extent in a direction parallel with a top surface of the substrate of an end portion of the third inorganic film is on the contacting portions,
   wherein the third inorganic film does not extend beyond the contacting portions in a direction parallel with the top surface of the substrate toward the second area.

2. The electronic device according to claim 1, wherein the third inorganic film is laminated over the second inorganic film.

3. The electronic device according to claim 1, wherein the third inorganic film is entirely in contact with the second inorganic film.

4. The electronic device according to claim 1, wherein
   the sealing layer further includes a second organic film interposed between the second inorganic film and the third inorganic film, and
   the third inorganic film is in contact with the second inorganic film at a portion which is nearer an edge of the substrate than the second organic film.

5. The electronic device according to claim 1, wherein the organic film has an upper surface sloping down at the second area, and the organic film is thinner closer to a tip.

6. The electronic device according to claim 1, further comprising a bank around the organic film, wherein
   the first inorganic film and the second inorganic film have respective tips between the organic film and an edge of the substrate, and
   the third inorganic film has a tip on the bank.

7. The electronic device according to claim 6, further comprising a second bank around the bank, wherein the first inorganic film and the second inorganic film have the respective tips on the second bank.

8. The electronic device according to claim 1, wherein the third inorganic film includes plural layers.

9. The electronic device according to claim 1, wherein the third inorganic film has a discontinuous shape in a frame area around the first area.

* * * * *